(12) United States Patent
Sasaki

(10) Patent No.: US 6,331,489 B2
(45) Date of Patent: *Dec. 18, 2001

(54) SEMICONDUCTOR DEVICE PRODUCTION METHOD

(75) Inventor: Takahiro Sasaki, Tokyo (JP)

(73) Assignee: NEC Corporation (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/551,780

(22) Filed: Apr. 18, 2000

(30) Foreign Application Priority Data

Apr. 21, 1999 (JP) ................................. 11-113143

(51) Int. Cl.⁷ ........................... H01L 21/302; B44C 1/22
(52) U.S. Cl. ............................. 438/745; 438/746; 216/41
(58) Field of Search ................................... 438/745, 746; 216/41, 14

(56) References Cited

U.S. PATENT DOCUMENTS

| | | | |
|---|---|---|---|
| 3,930,857 | * | 1/1976 | Bendz et al. .......................... 96/36.2 |
| 3,935,117 | * | 1/1976 | Suzuki et al. ......................... 252/79.1 |
| 4,078,945 | * | 3/1978 | Gonsiorawski ....................... 136/256 |
| 5,078,832 | * | 1/1992 | Tanaka ................................. 156/639 |
| 5,204,224 | * | 4/1993 | Suzuki ................................. 430/315 |
| 5,854,140 | * | 12/1998 | Jaso et al. ............................ 438/740 |
| 5,885,756 | * | 3/1999 | Yun et al. ............................ 430/394 |
| 5,960,305 | * | 9/1999 | Kumar ................................. 438/598 |
| 6,214,722 | * | 4/2001 | Lin et al. ............................. 438/637 |

* cited by examiner

Primary Examiner—Felisa Hiteshew
Assistant Examiner—Lynette T. Umez-Eronini
(74) Attorney, Agent, or Firm—Hayes, Soloway, Hennessey, Grossman & Hage, P.C.

(57) ABSTRACT

An entire surface of a semiconductor substrate is coated with photoresist and baked. A circuit pattern area in the region excluding a peripheral region of the semiconductor substrate is subjected to normal exposure while a non-circuit area (photoresist remaining area) in the peripheral region of the semiconductor substrate is subjected to a weak light so that the photoresist will not be removed completely during a development step and the remaining photoresist will have a hydrophilic surface. This improves wettability for a developing solution, enabling to apply the developing solution uniformly over the semiconductor substrate surface. This in turn reduces irregularities of circuit pattern dimensions due to uneven development.

4 Claims, 3 Drawing Sheets

SEMICONDUCTOR DEVICE PRODUCTION METHOD

BACKGROUND OF THE INVENTION

1. Field of the Invention

The present invention relates to a semiconductor device production method and in particular, to a semiconductor device production method which can preferably be used for a photoresist pattern formation.

2. Description of the Related Art

In general, when forming a circuit pattern such as a semiconductor integrated circuit on a semiconductor substrate, a photoresist pattern is formed by a photolithography procedure shown in FIG. 3 and after this, various post-treatments are performed. The photolithography procedure includes: pre-treatment (S100); photoresist application onto a semiconductor substrate (S101) which has been subjected to the pretreatment; an exposure step (S102) for exposing a circuit pattern such as a semiconductor integrated circuit, onto the semiconductor substrate having the photoresist; and a developing step (S103) for developing the semiconductor substrate having the circuit pattern exposed.

Conventionally, a semiconductor substrate 1 is divided into a circuit pattern area 2 and a non-circuit pattern area 3, i.e., a photoresist remaining area where the photoresist film is to remain so as not to be exposed to light. Only the circuit pattern area 2 is exposed to light and after this the entire semiconductor substrate 1 is developed to form the circuit pattern.

However, when the aforementioned photolithography uses a chemically amplified photoresist, in the circuit pattern area 2, acid generated by exposure de-protects a protection group of the photoresist 4 and the surface of the photoresist 4 becomes hydrophilic while in a non-exposed area, i.e., the photoresist remaining area 3, the surface of the photoresist 4 remains hydrophobic. Accordingly, in the development step S103, as shown in FIG. 4, water or developing solution 5 is expelled by the photoresist remaining area 3 and gathered in the circuit pattern area 2.

As a result, the water or developing solution 5 is not uniformly placed on the circuit pattern area 2, which disables uniform development. Fluctuation of pattern dimensions of the circuit pattern area 2 at the pattern dimension measuring row 6 shown in FIG. 2 becomes greater toward the photoresist remaining area 3. That is, the uniformity of the pattern dimensions in the semiconductor substrate 1 becomes worse. This problem is also present in the wet etching processing when using an etching solution for wet-etching the semiconductor substrate 1 having a photoresist pattern formed.

SUMMARY OF THE INVENTION

It is therefore an object of the present invention to provide a semiconductor device production method for improving the dimension uniformity of a photoresist pattern formed on a semiconductor substrate so as to obtain uniformity of a processing such as a wet etching performed after the photoresist pattern formation.

According to an aspect of the present invention, there is provided a semiconductor device production method in which photoresist is applied to the entire surface of a semiconductor substrate and patterning is performed only on a region excluding a peripheral region of the semiconductor substrate, leaving the photoresist on a peripheral region of the semiconductor substrate, wherein when exposing the photoresist, a predetermined light quantity is applied to the peripheral region, so that the photoresist on the peripheral region will not be removed completely by development.

According to another aspect of the present invention, there is provided a semiconductor device production method in which photoresist is applied to the entire surface of a semiconductor substrate and patterning is performed only on a region excluding a peripheral region of the semiconductor substrate, leaving the photoresist on a peripheral region of the semiconductor substrate, after which a wet etching is performed using an etching solution, wherein when exposing the photoresist, a predetermined light quantity is applied to the peripheral region, so that the photoresist on the peripheral region will not be removed completely by development, thus making a surface of the photoresist on the peripheral region hydrophilic so as to improve wettability of the etching solution.

DESCRIPTION OF THE PREFERRED EMBODIMENTS

The semiconductor device production method according to a preferred embodiment of the present invention is realized as follows. The entire surface of a semiconductor surface is coated with photoresist and subjected to baking. Then, the circuit pattern area (2 in FIG. 1) at the center of the semiconductor substrate is subjected to a normal exposure, and the photoresist remaining region (3 in FIG. 1) is subjected to a weaker light so that the photoresist will not be removed completely in the development step of a later stage and the photoresist surface of this area is made hydrophilic, thus improving wettability for a developing solution. Thus, the developing solution can be uniformly placed on the semiconductor substrate, thus enabling to reduce irregularities of the circuit pattern dimensions due to uneven development.

EXAMPLE

Figure 1:
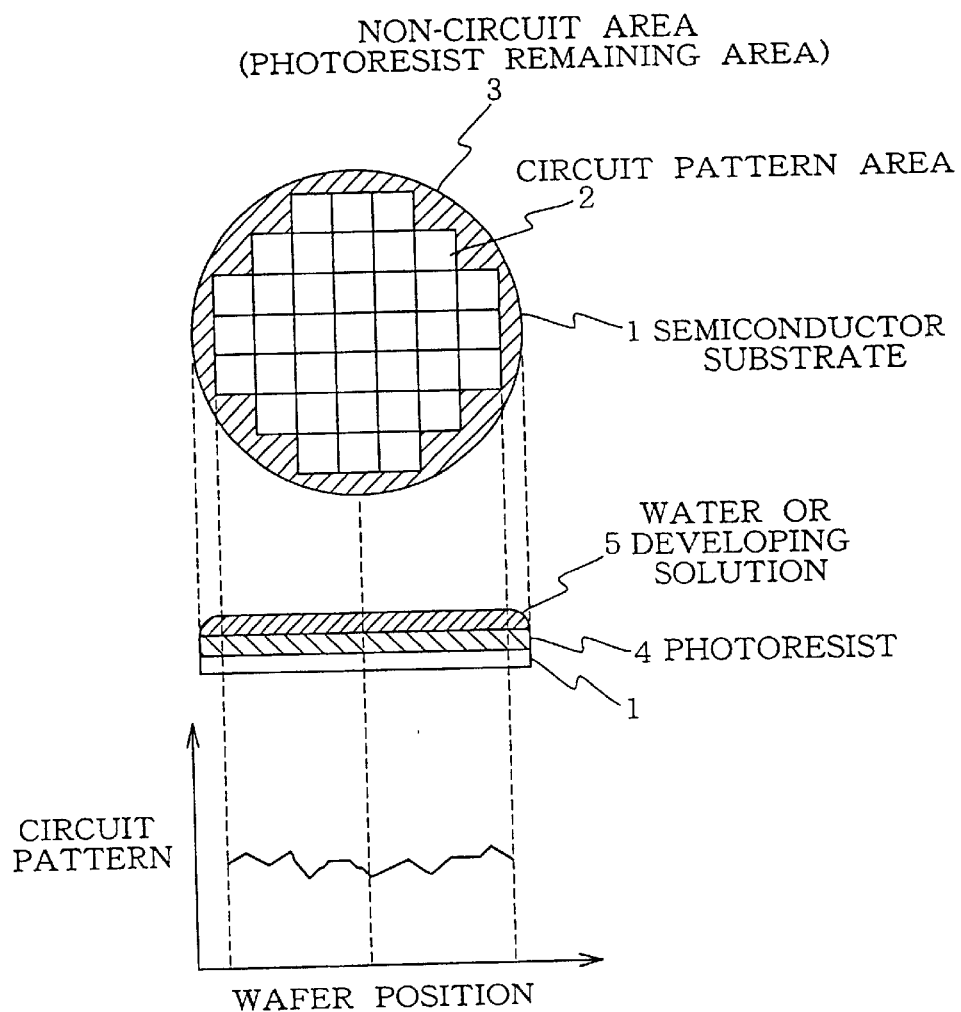
FIG. 1 schematically shows a step of a semiconductor device production method according to an embodiment: a plan view showing a developing solution applied on a semiconductor substrate having photoresist; a cross sectional view; and a graph showing a circuit pattern dimension on the semiconductor substrate surface.
Figure 2:
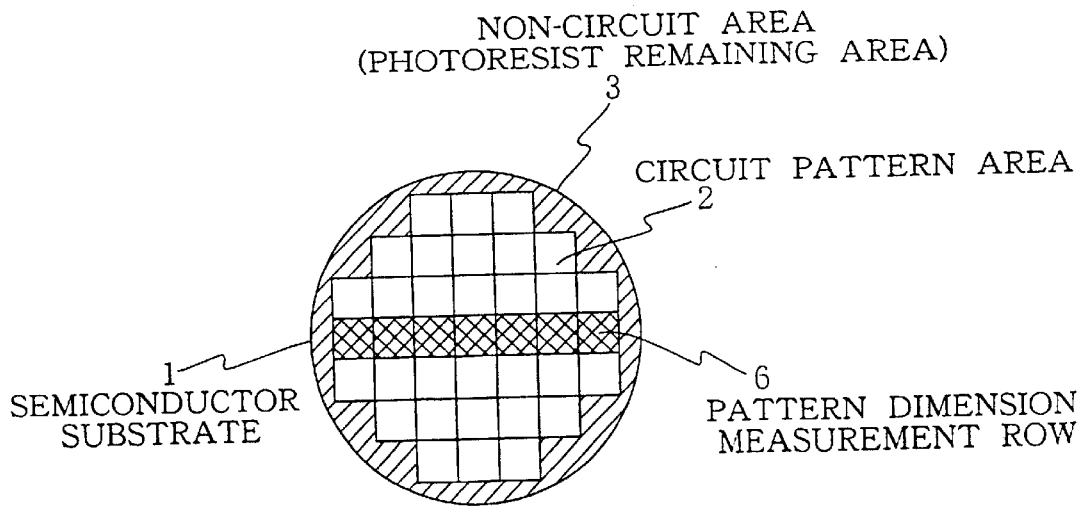
FIG. 2 is a plan view of a circuit pattern dimension measurement row.
Figure 3:
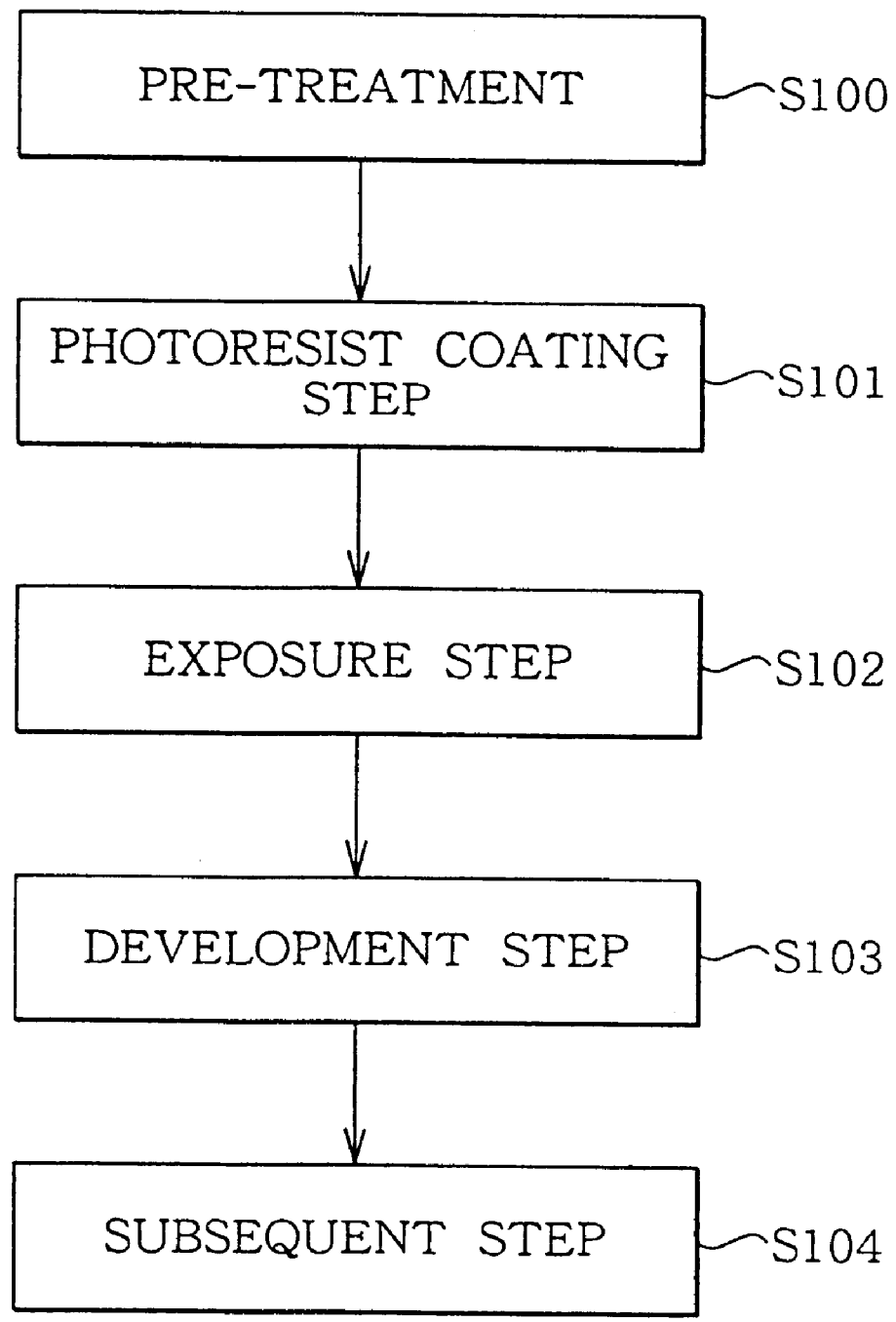
FIG. 3 is a flowchart showing a photoresist pattern formation procedure.
Figure 4:
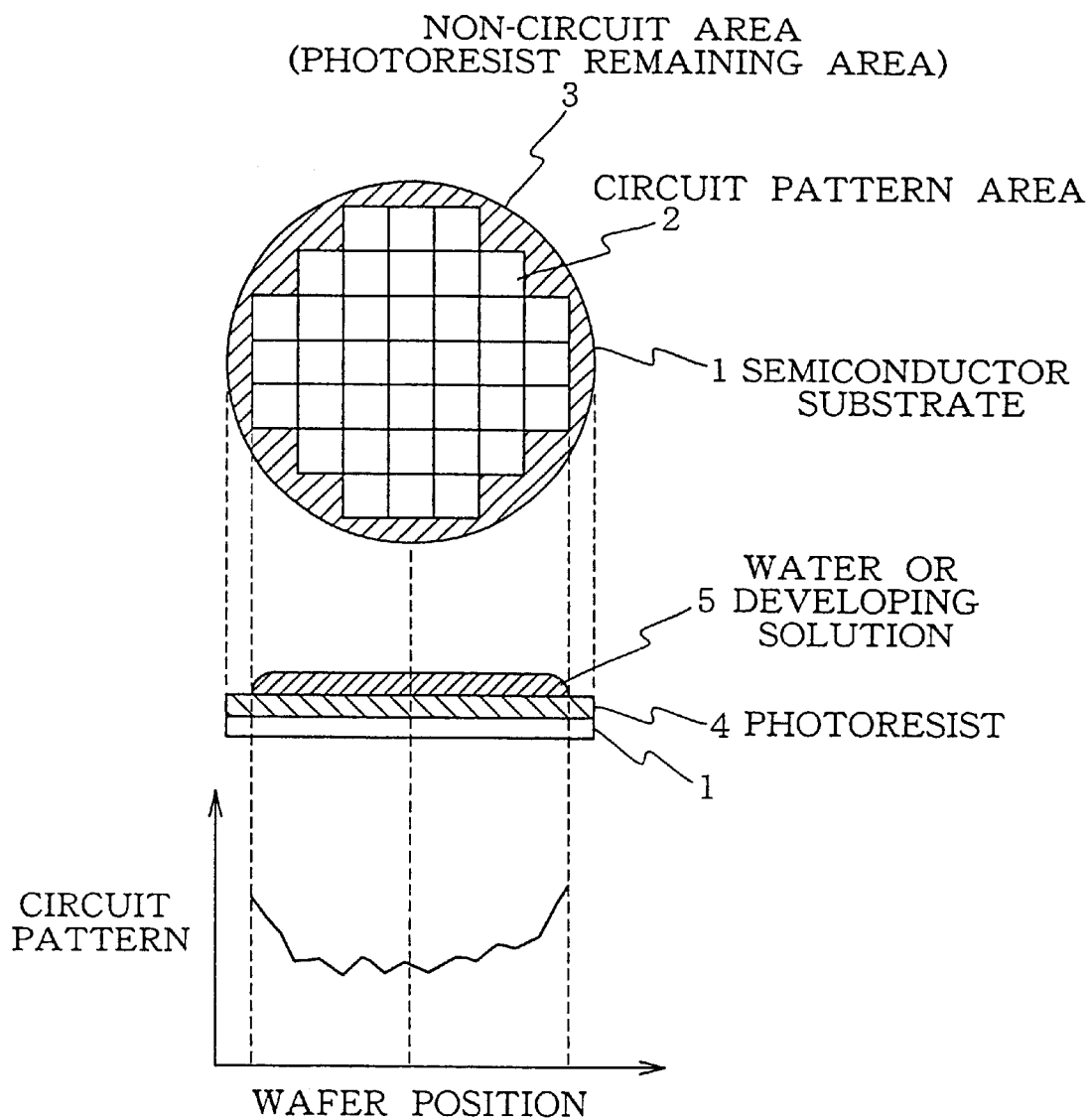
FIG. 4 schematically shows a step of a conventional semiconductor device production method: a plan view showing a developing solution applied on a semiconductor substrate having photoresist; a cross sectional view; and a graph showing a circuit pattern dimension on the semiconductor substrate surface.

The aforementioned embodiment of the present invention will be further detailed with reference to FIG. 1 to FIG. 3. FIG. 1 includes a plan view and a cross sectional view of a semiconductor substrate covered with a developing solution, and a graph showing circuit pattern dimensions on the semiconductor substrate. Moreover, FIG. 2 shows a circuit pattern dimension measurement place. FIG. 3 is a flowchart showing an ordinary photoresist pattern formation procedure.

Firstly, referring to FIG. 3, an outline of the photoresist pattern formation procedure will be explained. The photoresist pattern formation procedure includes: a pre-treatment (S100) of a semiconductor substrate; a photoresist coating and baking step (S101) for applying a predetermined thickness of photoresist onto the semiconductor substrate and baking the semiconductor substrate coated with the photoresist; an exposure step (S102) for exposing a circuit pattern such as a semiconductor integrated circuit by using an exposure apparatus, onto a predetermined area of the semiconductor substrate coated with the photoresist; a development step (S103) for developing the circuit pattern exposed on the semiconductor substrate; and a subsequent step (S104) for using the photoresist pattern for etching, ion injection, or the like.

According to the present embodiment, in the exposure step, light of weak exposure energy is applied to the non-circuit area (photoresist remaining area), so that the photoresist film will not melt completely in the development step S103. Moreover, when the subsequent step is dry etching, light of weak exposure energy is applied to the non-circuit area (photoresist remaining area) so that a photoresist film will remain after the dry etching.

That is, a weak light is applied to the non-circuit area (photoresist remaining area) 3, so that acid is generated in the chemically amplified photoresist. The acid de-protects the protection group of the chemically amplified photoresist, so that the photoresist surface becomes hydrophilic. Thus, in the development step (S103), when water or developing solution 5 is applied onto the semiconductor substrate 1, the water or developing solution 5 spreads uniformly on the semiconductor substrate 1.

That is, the water or the developing solution 5 is not expelled by the non-circuit area and spreads uniformly over the semiconductor substrate 1. This improves uniformity of the circuit pattern dimensions in the circuit pattern area 2. This effect is not to be limited to the water or the developing solution 5. For example, if the subsequent step S104 is a wet etching step using a water soluble etching solution, the etching solution can be uniformly spread over the semiconductor substrate 1. Thus, the etching reaction can be uniformly controlled over the semiconductor substrate 1, enabling to obtain a uniform etching processing.

As has been described above, according to the present invention, a weak light is applied to the noncircuit area (photoresist remaining area) at the periphery of the semiconductor substrate, so that the non-circuit area becomes hydrophilic by a chemical reaction, thus enabling to uniformly spread an aqueous solution such as a developing solution and an etching solution over the semiconductor substrate. This results in uniform dimensions of a circuit pattern formed on the semiconductor substrate.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A semiconductor production method comprising the steps of:
   (a) coating an entire surface of a semiconductor substrate with a photoresist;
   (b) exposing said surface excluding a far peripheral region thereof in a first patterned exposure to light energy of a first intensity;
   (c) exposing said far peripheral region in a second patterned exposure to light energy of a second intensity lower than said first intensity; and
   (d) applying a development solution uniformly to said photoresist coating to develop exposed areas of said photoresist whereby to remove completely areas of said photoresist exposed to said first light energy intensity in exposure step (b) while removing only partly a portion in the thickness of said far peripheral region of said photoresist exposed to said second light energy intensity in exposure step (c).

2. A method according to claim 1, and further comprising performing an etching step (e) following said development step (d).

3. A method according to claim 2, wherein said etching step (e) comprises wet etching.

4. A method according to claim 2, wherein said etching step (e) comprises a dry etching.

* * * * *